United States Patent [19]
Lee et al.

[11] Patent Number: 6,057,562
[45] Date of Patent: May 2, 2000

[54] HIGH EFFICIENCY LIGHT EMITTING DIODE WITH DISTRIBUTED BRAGG REFLECTOR

[75] Inventors: Biing-Jye Lee; Ming-Jiunn Jou; Jacob C. Tarn; Chiung-Sheng Shyu, all of Hsinchu, Taiwan

[73] Assignee: Epistar Corp., Hsin-Chu, Taiwan

[21] Appl. No.: 08/840,914

[22] Filed: Apr. 18, 1997

[51] Int. Cl.[7] .................................................. H01L 33/00
[52] U.S. Cl. ............................. 257/96; 257/98; 257/99; 257/103
[58] Field of Search ................................. 257/14, 22, 96, 257/98, 99, 103; 372/45, 46

[56] References Cited

U.S. PATENT DOCUMENTS

| | | |
|---|---|---|
| Re. 35,665 | 11/1997 | Lin et al. ................................... 257/94 |
| 5,048,035 | 9/1991 | Sugawara et al. ......................... 257/94 |
| 5,661,742 | 8/1997 | Huang et al. .............................. 257/94 |

*Primary Examiner*—Minh-Loan Tran
*Attorney, Agent, or Firm*—H. C. Lin

[57] ABSTRACT

A structure of a light emitting diode (LED) having high brightness is disclosed. This LED includes a substrate on a first electrode, a first cladding layer of a first conductivity type on the substrate, an active layer on the first cladding layer, a second cladding layer of a second conductivity type on the active layer, a window layer of the second conductivity type on the second cladding layer, wherein the electrical resistivity of the window layer is less than that of the second cladding layer, a contact layer of the second conductivity type on the window layer for providing ohmic contact, and a conductive transparent oxide layer on the contact layer, wherein the electrical resistivity of the conductive transparent oxide layer is less than that of the window layer and the contact layer.

23 Claims, 5 Drawing Sheets

HIGH EFFICIENCY LIGHT EMITTING DIODE WITH DISTRIBUTED BRAGG REFLECTOR

BACKGROUND OF THE INVENTION

1. Field of the Invention

The present invention relates to the structure of a light emitting diode (LED), and more particularly to the structure of a surface emitting LED with a window layer and a conductive transparent oxide layer for obtaining high brightness.

2. Description of the Prior Art

AlGaInP alloy technology has been used for making light emitting diodes (LEDs) of wavelength ranging from about 550 to 680 nanometers by adjusting the aluminum to gallium ratio in the active region of the LEDs. Further, metalorganic vapor phase epitaxy (MOVPE) is used to grow efficient AlGaInP heterostructure devices. A conventional LED contains a double heterostructure of AlGaInP, which includes an n-type AlGaInP cladding layer formed on an n-type substrate of GaAs, an active layer of AlGaInP formed on the n-type cladding layer, and a p-type AlGaInP cladding layer formed on the active layer.

For efficient operation of the LED, injected current should be spread evenly in the lateral direction, so that the current will cross the p-n junction of the double heterostructure of AlGaInP uniformly to generate light evenly. The p-type AlGaInP cladding layer, which is grown by MOVPE process, is very difficult to dope with acceptors of a concentration higher than 1E18 cm$^{-3}$. Further, hole mobility (about 10 to 20 cm$^2$*v/sec) is low in p-type AlGaInP semiconductor. Due to these factors, the electrical resistivity of the p-type AlGaInP layer is comparatively high (about 0.3–0.6 Ω-cm normally), so that current spreading is severely restricted. Consequently, current tends to concentrate, and is often referred to as a current crowding problem.

One technique to solve the current crowding problem is disclosed by Fletcher et. al. in U.S. Pat. No. 5,008,718. The structure of the proposed LED is shown in FIG. 1, and is fabricated with a back electrical contact 10, a substrate of n-type GaAs 12, a double heterostructure of AlGaInP 14, a window layer of p-type GaP 16, and a front electrical contact 18. The double heterostructure of AlGaInP 14 mentioned above includes a bottom cladding layer of n-type AlGaInP 140, an active layer of AlGaInP 142, and a top cladding layer of p-type AlGaInP 144. The window layer 16 should be selected from materials that have a low electrical resistivity so that current can spread out quickly, and have a band gap higher than that of the AlGaInP layers so that the window layer 16 is transparent to light emitted from the active layer of AlGaInP 142.

In an LED for generating light in the spectrum from red to orange, AlGaAs material is selected to form the window layer 16. The AlGaAs material has the advantage of having a lattice constant compatible with that of the underlying GaAs substrate 12. In an LED for generating light in the spectrum from yellow to green, GaAsP or GaP material is used to form the window layer 16. It is a drawback of using the GaAsP or the GaP material that their lattice constants are not compatible with those of the AlGaInP layers 14 and the GaAs substrate 12. This lattice mismatch causes a high dislocation density that produces less than satisfactory optical performance. In Applied Physics Letter, vol 61 (1992), p. 1045, K. H. Huang et. al. discloses a similar structure having a thick layer 16 of about 50 μm (or 500000 angstroms) in thickness. This structure provides a three-times illuminance efficiency than an LED without a window layer, and two-times illuminance efficiency than an LED with a window layer of about 10 μm in thickness. The fabrication of this structure unfavorably requires two different processes of metalorganic vapor phase epitaxy (MOVPE) for growing the double heterostructure of AlGaInP, and vapor phase epitaxy (VPE) for forming the thick window layer of GaP 16, thereby increasing manufacturing time and complexity.

FIG. 2 shows another prior art LED, which is disclosed in U.S. Pat. No. 5,048,035. In this figure, the layers that are not changed in appearance from the structure of FIG. 1 are labeled with the same reference numerals. The LED of FIG. 2, in addition to the structure of FIG. 1, is fabricated with a current-blocking layer of AlGaInP 20 on a portion of the double heterostructure 14, and a contact layer of GaAs 22 between the window layer 16 and the electrode 18. The current-blocking layer 20 is arranged at a position where it is in alignment with the front electrode 18 and thus current is spread out laterally by the current-blocking layer 20. Two MOVPE processes are disadvantageously required in fabricating this structure, i.e., forming the heterostructure 14 and the current-blocking layer 20 by a first MOVPE, followed by a photolithography technique to define the area of the current-blocking layer 20, and forming the window layer 16 by a second MOVPE.

FIG. 3 shows a third prior art LED disclosed in U.S. Pat. No. 5,359,209. In this figure, the layers that are not changed in appearance from the structure of FIG. 1 are labeled with the same reference numerals. The LED of FIG. 3, in addition to the structure of FIG. 1, is fabricated with an additional p-type window layer of GaAs 30 between the heterostructure 14 and the p-type window layer of GaP 16. Although the window layer of GaAs 30 has good conductivity with carrier concentration of 10$^{19}$ cm$^{-3}$ or more, the structure induces a light absorption phenomenon due to the fact that the energy gap of GaAs is substantially less than that of AlGaInP in the active layer 142.

FIG. 4 further shows a prior art LED disclosed in U.S. Pat. No. 5,481,122. In this figure, the layers that are not changed in appearance from the structure of FIG. 1 are labeled with the same reference numerals. The window layer of GaP 16 in FIG. 1 is now replaced by a p-type contact layer 40 and a conductive transparent oxide layer 42 in FIG. 4. Indium tin oxide (ITO) is preferably used for forming the conductive transparent oxide layer 42, which has high transparency rate at about 90% in the range of visible light. Further, its electrical resistivity (about 3×10$^{-4}$ Ω-cm) is about 1000 times smaller than that of p-type AlGaInP, and about 100 times smaller than that of p-type GaP. However, the optimal thickness of about 1000–50000 angstroms does not provide a good condition for effectively emitting light, thereby confining the illuminance efficiency of the LED.

SUMMARY OF THE INVENTION

The object of the present invention is to obtain high brightness and reduce manufacturing time for an LED having spectrum ranging from red to green by using a window layer and a conductive transparent oxide layer.

Another object of the present invention is to provide an LED, wherein most processes in forming the LED use only metalorganic vapor phase epitaxy (MOVPE), thereby achieving high controllability of composition, carrier concentration, layer thickness, and simplifying manufacturing.

A further object of the present invention is to provide an LED using multiple quantum well structure as an active layer to improve the quality of the crystalline and the illuminance efficiency of the LED.

Moreover, an object of the present invention is to provide an LED with a distributed Bragg reflector to eliminate the absorption of the light emitted from the active layer by the substrate, thereby increasing extraction efficiency of the LED.

In accordance with the present invention, a structure of LEDs is provided for obtaining high brightness. In one embodiment, the LED is fabricated with a substrate formed on a first electrode, a first cladding layer of a first conductivity type formed on the substrate, an active layer formed on the first cladding layer, and a second cladding layer of a second conductivity type formed on the active layer. Further, the LED includes a window layer formed on the second cladding layer, where the electrical resistivity of the window layer is less than that of the second cladding layer. A contact layer is then formed on the window layer for providing ohmic contact. Finally, the LED also includes a conductive transparent oxide layer formed on the contact layer, where the electrical resistivity of the conductive transparent oxide layer is less than that of the window layer and the contact layer.

In another embodiment of the present invention, an additive distributed Bragg reflector layer having some sublayers is further formed between the substrate and the first cladding layer, thereby increasing extraction efficiency of the LED.

BRIEF DESCRIPTION OF THE DRAWINGS

The present invention can be fully understood by reading the subsequent detailed description of the preferred embodiments thereof with references made to the accompanying drawings, wherein.

DESCRIPTION OF THE PREFERRED EMBODIMENT

Figure 1:
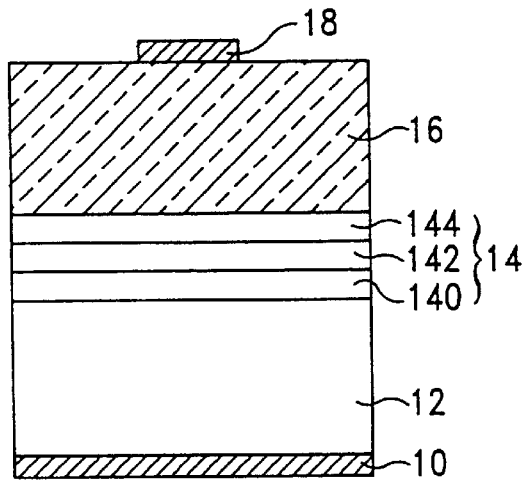
FIG. 1 shows a cross-sectional view of a first prior art LED.
Figure 2:
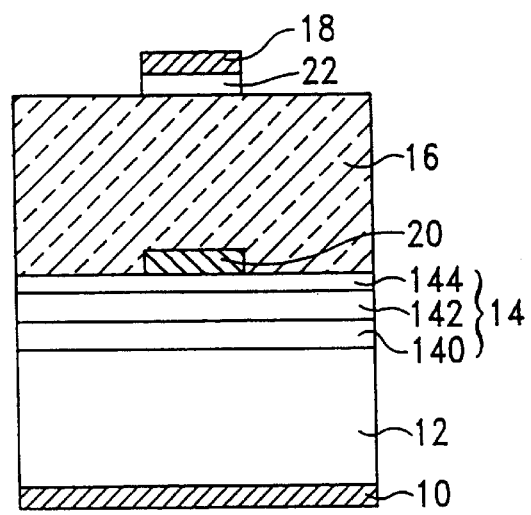
FIG. 2 shows a cross-sectional view of a second prior art LED.
Figure 3:
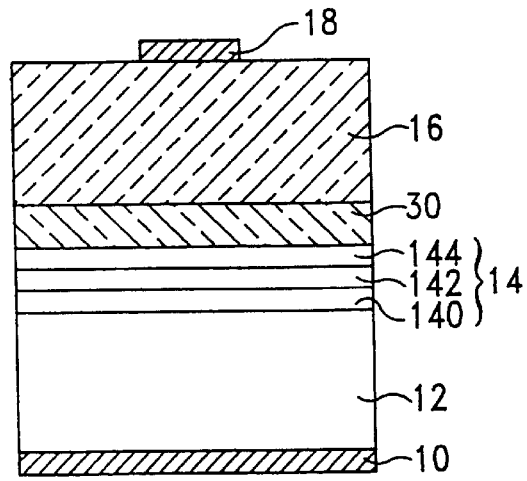
FIG. 3 shows a cross-sectional view of a third prior art LED.
Figure 4:
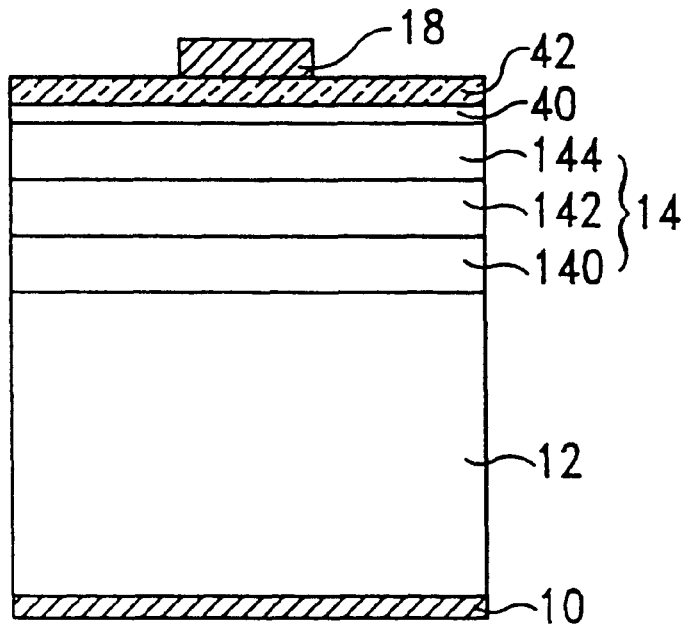
FIG. 4 shows a cross-sectional view of a fourth prior art LED.
Figure 5:
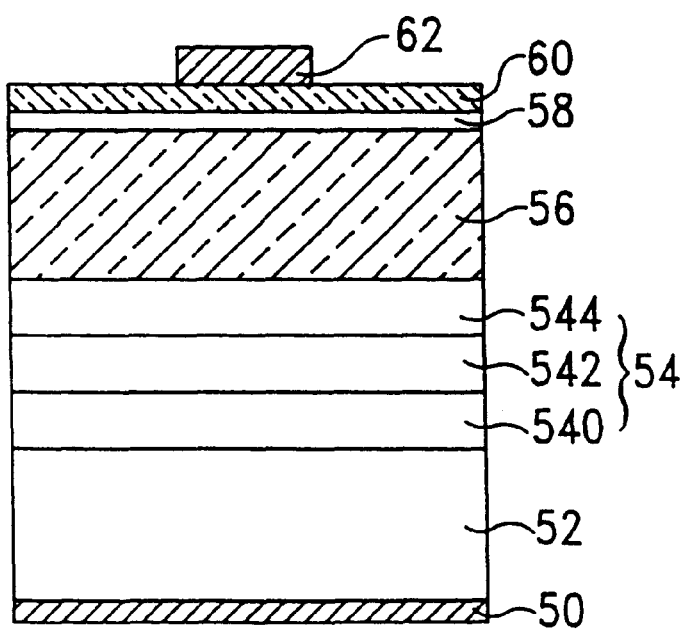
FIG. 5 shows a cross-sectional view illustrative of an LED in accordance with one embodiment of the present invention.

FIG. 5 shows a cross-sectional view illustrative of a light emitting diode (LED) in accordance with one embodiment of the present invention. A back electrical contact 50 is provided to act as a back electrode. An n-type electrode is used in this embodiment and, however, it is appreciated that p-type electrode can be used instead without departing from the scope of the claimed invention.

A substrate 52 is then formed on the n-type electrode 50. In this embodiment, an n-type GaAs layer 52 is conventionally formed to a thickness of about 350 μm. A stacked structure of AlGaInP 54, which is often referred to as active p-n junction layer, is formed on the substrate 52. In this embodiment, the stacked structure 54 includes a bottom n-type cladding layer of AlGaInP 540, an active layer of AlGaInP 542, and a top p-type cladding layer of AlGaInP 544. The thickness of the bottom cladding layer 540, the active layer 542 and the top cladding layer 544 is preferably about 1.0, 0.75, and 1.0 μm respectively.

Figure 6B:
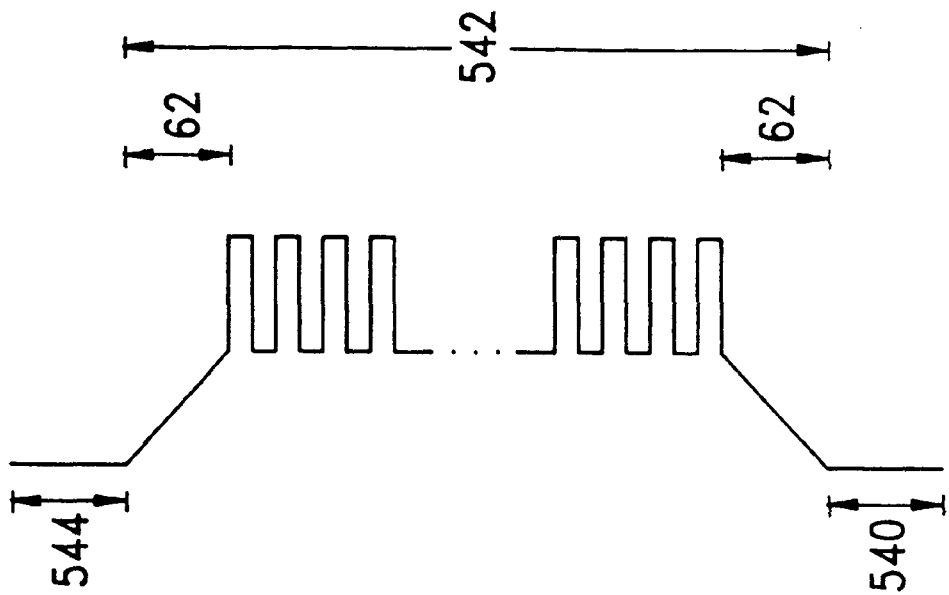
FIG. 6B shows a band structure of a graded index separate confinement MQW.
Figure 6A:
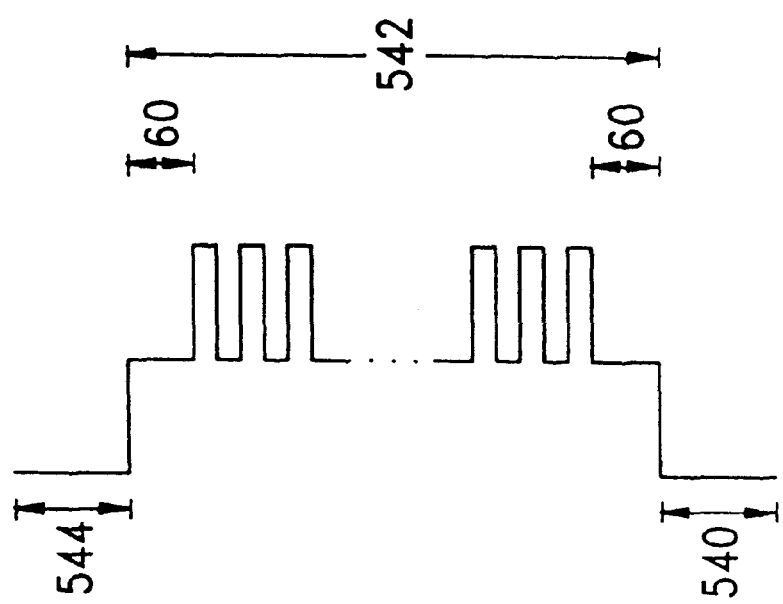
FIG. 6A shows a band structure of a step index separate confinement MQW.

In one implementation of this embodiment, the active layer 542 is formed using a conventional double heterostructure (DH) technique. In another implementation, the active layer 542 is formed using another conventional multiple quantum well (MQW) technique. Owing to quantum effect, the proportion of Al in the active layer 542 decreases, therefore reducing proportion of oxygen therein. Consequently, the quality of the crystalline is improved, and the illuminance efficiency of the LED increases accordingly. Further, carrier overflow phenomenon is reduced to confine carriers inside the quantum wells because the carrier concentration in each quantum well is reduced as the number of the quantum wells becomes large. There are generally two types of multiple quantum well structure. FIG. 6A shows a band structure of a step index separate confinement MQW, in which there are step-shaped confining layers 60 between the cladding layers 540, 544 and the MQW active layer 542. On the contrary, a graded index separate confinement MQW as shown in FIG. 6B uses graded confining layers 62 within the cladding layers 540, 544 and the MQW active layer 542. For shorter wavelength (about 575~560 nm) LED structure with weaker quantum well confinement, the graded index separate confinement MQW achieves a better illuminance efficiency since it contains a reduced density of states in the confining layers 60.

Referring back to FIG. 5, a p-type window layer 56 having a thickness of about 10 μm is formed on the top cladding layer 544. The electrical resistivity of the window layer 56 (about 0.05 Ω-cm) is less than or equal to that of the top cladding layer 544. Transparent material, such as GaP, GaAsP, GaInP or AlGaAs is preferably used. This window layer 56 is used to improve the illuminance efficiency of the LED. For example, a conventional 590 nm LED without a window layer usually has brightness of 15 minicandela (or mcd). However, 30 mcd or more can be obtained by adding the window layer 56 on the top cladding layer 544.

Figure 7A:
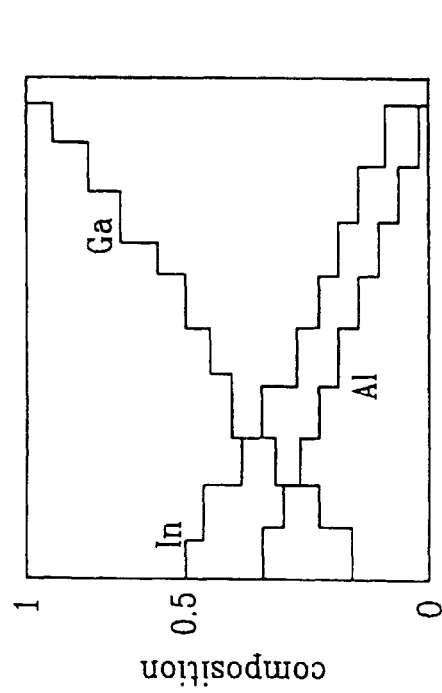
FIG. 7A shows a staircase formation for forming a compositional grading window layer.
Figure 7B:
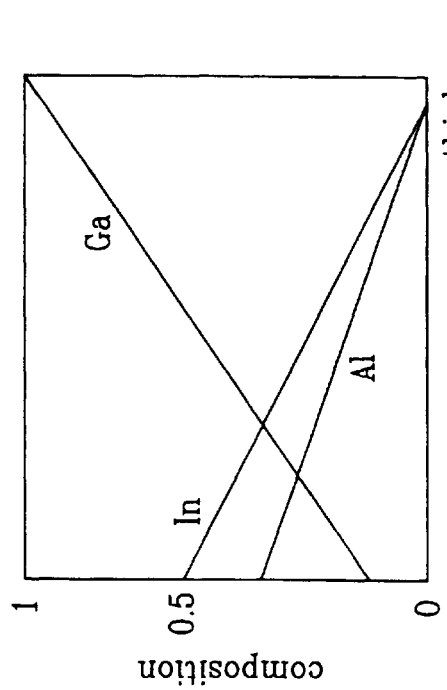
FIG. 7B shows a linear formation for forming a compositional grading window layer.
Figure 7C:
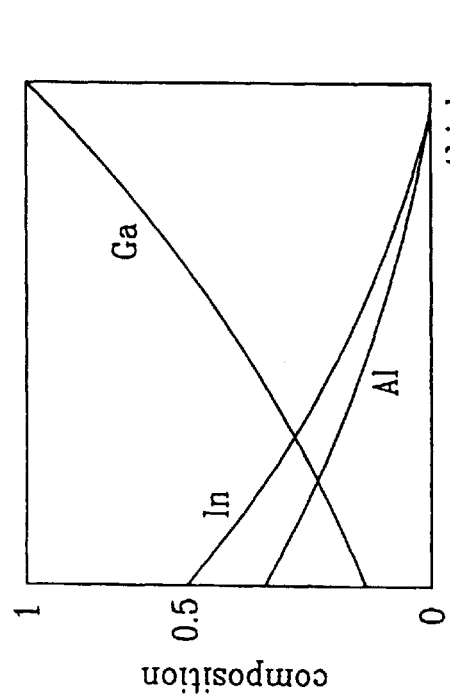
FIG. 7C shows a sublinear formation for forming a compositional grading window layer.
Figure 7D:
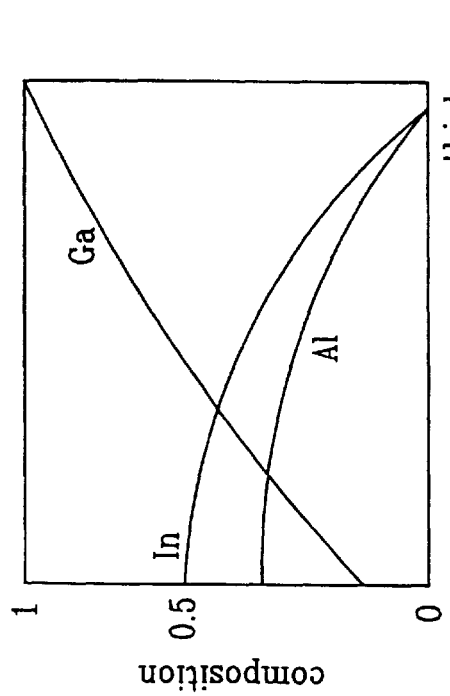
FIG. 7D shows a superlinear formation for forming a compositional grading window layer.

The window layer 56 can also be formed as a compositional grading window layer by gradually adjusting the composition of AlGaInP. FIG. 7A shows a staircase formation of the window layer 56, where the proportion of Ga, In or Al is changed stepwisely along the thickness of the window layer 56. FIG. 7B shows another similar situation, where the proportion of Ga, In, or Al is changed linearly. Similarly, FIG. 7C illustrates a sublinear formation, and FIG. 7D illustrates a superlinear formation. The staircase and the linear formations have advantage of high controllability and stability. The sublinear formation has advantage of thicker window layer because of its low defect density, and the superlinear formation can be used to increase illuminance efficiency by lowering resistivity of the window layer 56. Generally, use of a compositional grading window layer 56 makes its lattice constant compatible with that of the underlying double heterostructure layer 54.

Referring to FIG. 5 again, a p-type contact layer 58 is formed on the window layer 56. GaAsP, GaP, GaInP, or GaAs is used to form this contact layer 58. In this embodiment, the carrier concentration is greater than $5 \times 10^{18}$ cm$^{-3}$, and its thickness is greater than 500 angstroms, so that a good ohmic contact can be formed between the window layer 56 and a conductive transparent oxide layer 60, which will be described later. The electrical resistivity of the conductive transparent oxide layer 60 (about $3 \times 10^{-4}$ Ω-cm) is smaller than that of the contact layer 58 (about 0.01 Ω-cm) and the window layer 56 (about 0.05 Ω-cm).

Tin oxide, indium oxide, or indium tin oxide (ITO) is preferably used to form the conductive transparent oxide layer 60. The preferred thickness of the conductive transparent oxide layer 60 is between 1000 angstroms to 50000 angstroms. Therefore, the transmittance of the conductive transparent oxide layer 60 is excellent for LEDs in the wavelength range from 550 nanometers (green) to 630 nanometers (red). The conductive transparent oxide layer 60 does not absorb photons emitted from the active layer 542, and its electrical resistivity is only about $3 \times 10^{-4}$ Ω-cm, so that the injected current may substantially spread out through the entire diode, thereby contributing to higher power output.

As the window layer 56 is not thick enough to provide good spreading capability for overcoming the current crowding problem, the window layer 56 and the conductive transparent oxide layer 60 work together to provide LEDs with high brightness. In this embodiment, 50 mcd or more can be obtained compared to 15 mcd for a conventional LED without the window layer 56 and the conductive transparent oxide layer 60. Finally, a p-type electrical contact 62 is formed on a portion of the conductive transparent oxide layer 60 to act as a front electrode. It is noted that each layer, except the conductive transparent oxide layer 60 and the electrodes 50, 62, shown in FIG. 5 can be grown using metalorganic vapor phase epitaxy (MOVPE) method, thereby achieving high controllability of composition, carrier concentration, layer thickness, and simplifying manufacturing.

Figure 8:
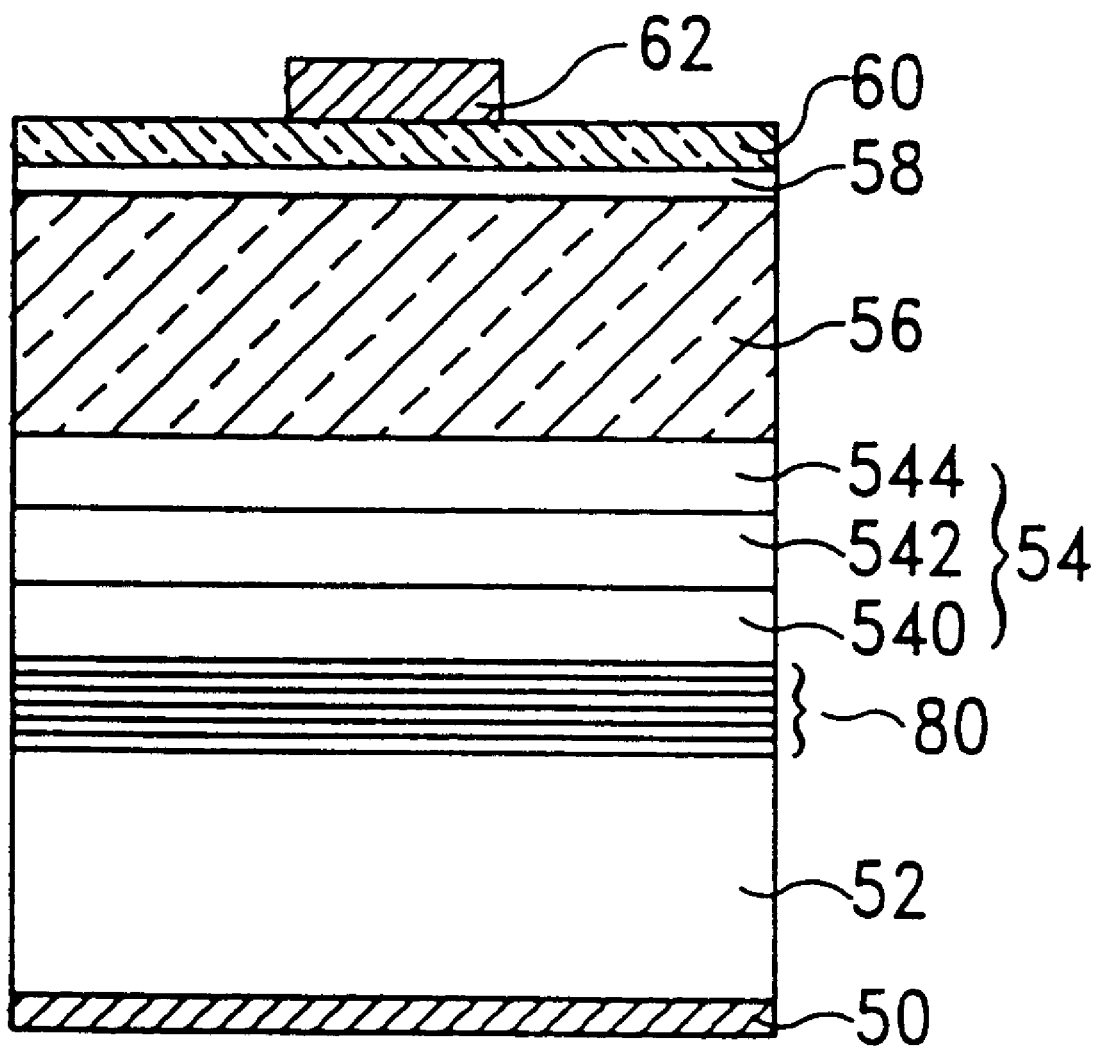
FIG. 8 shows a cross-sectional view illustrative of an LED in accordance with another embodiment of the present invention.

FIG. 8 shows a cross-sectional view illustrative of an LED in accordance with another embodiment of the present invention. Layers that are not changed in appearance from the structure of FIG. 5 are labeled with the same reference numerals, and are not described in detailed. The basic difference from the structure of FIG. 5 is the additive distributed Bragg reflector (DBR) layer 80. AlGaInP or AlGaAs is preferably used in forming this DBR layer 80, which includes a stack of more than 20 layers in this embodiment. The DBR layer 80 is primarily used to eliminate the absorption of the light emitted from the active layer 542 by the substrate 52, thereby increasing extraction efficiency of the LED. In this embodiment, 80~100 mcd can be obtained by using the DBR layer 80.

Although specific embodiments have been illustrated and described, it will be obvious to those skilled in the art that various modifications may be made without departing from the spirit which is intended to be limited solely by the appended claims.

What is claimed is:

1. A light emitting diode comprising:
   a substrate formed on a first electrode;
   a distributed Bragg reflector layer of a first conductivity type having more than twenty sublayers formed on said substrate;
   a first cladding layer of the first conductivity type formed on said distributed Bragg reflector layer;
   an active layer formed on said first cladding layer;
   a second cladding layer of a second conductivity type formed on said active layer;
   a window layer of the second conductivity type formed on said second cladding layer, electrical resistivity of said window layer being less than electrical resistivity of said second cladding layer;
   a contact layer of the second conductivity type formed on the said window layer for providing ohmic contact; and
   a conductive transparent oxide layer formed on said contact layer, electrical resistivity of said conductive transparent oxide layer being less than the electrical resistivity of said window layer and said contact.

2. The light emitting diode according to claim 1, wherein said active layer comprises AlGaInP.

3. The light emitting diode according to claim 2, wherein said active layer comprises an AlGaInP multiple quantum well structure.

4. The light emitting diode according to claim 1, wherein said window layer comprises a material chosen from the group consisting of GaP, GaAsP, GaInP, and AlGaAs.

5. The light emitting diode according to claim 1, wherein said window layer comprises a compositional grading layer of AlGaInP.

6. The light emitting diode according to claim 5, wherein said compositional grading layer is formed by changing proportion of Ga, In, and Al in a staircase manner during formation.

7. The light emitting diode according to claim 5, wherein said compositional grading layer is formed by changing proportion of Ga, In, and Al in a linear manner during formation.

8. The light emitting diode according to claim 5, wherein said compositional grading layer is formed by changing proportion of Ga, In, and Al in a sublinear manner during formation.

9. The light emitting diode according to claim 5, wherein said compositional grading layer is formed by changing proportion of Ga, In, and Al in a superlinear manner during formation.

10. The light emitting diode according to claim 1, wherein said contact layer comprises a material chosen from the group consisting of GaAsP, GaP, GaInP, and GaAs.

11. The light emitting diode according to claim 1, wherein said conductive transparent oxide layer comprises a material chosen from the group consisting of indium tin oxide, indium oxide, tin oxide, zinc oxide, and magnesium oxide.

12. The light emitting diode according to claim 1, wherein said substrate comprises GaAs.

13. The light emitting diode according to claim 1, wherein said first cladding layer comprises AlGaInP.

14. The light emitting diode according to claim 1, wherein said second cladding layer comprises AlGaInP.

15. The light emitting diode according to claim 1, wherein said distributed Bragg reflector layer comprises a material chosen from the group consisting of AlGaInP and AlGaAs.

16. A light emitting diode comprising:
   a substrate formed on a first electrode;
   a distributed reflector layer of a first conductivity type having more than twenty sublayers, said distributed Bragg reflector layer being formed on said substrate;
   a first claddding layer of the first conductivity type formed on said distributed Bragg reflector layer;
   an active layer formed on said first cladding layer;

a second cladding layer of the second conductivity type formed on said active layer;

a contact layer of the second conductivity type formed on said second cladding layer for providing ohmic contact; and a conductive transparent oxide layer formed on said contact layer.

17. The light emitting diode according to claim 16, wherein said active layer comprises AlGaInP.

18. The light emitting diode according to claim 16, wherein said contact layer comprises a material chosen from the group consisting of GaAsP, GaP, GaInP, and GaAs.

19. The light emitting diode according to claim 16, wherein said conductive transparent oxide layer comprises a material chosen from the group consisting of indium tin oxide, indium oxide, tin oxide, zinc oxide, and magnesium oxide.

20. The light emitting diode according to claim 16, wherein said first cladding layer comprises AlGaInP.

21. The light emitting diode according to claim 16, wherein said second cladding layer comprises AlGaInP.

22. The light emitting diode according to claim 16, wherein said distributed Bragg reflector layer comprises a material chosen from the group consisting of AlGaInP and AlGaAs.

23. A light emitting diode according to claim 16, wherein said active layer comprises an AlGaInP multiple quantum well structure.

* * * * *